US012804899B2

(12) United States Patent
Kong et al.

(10) Patent No.: US 12,804,899 B2
(45) Date of Patent: Nov. 17, 2026

(54) INTEGRATED CIRCUITRY COMPRISING A MEMORY ARRAY COMPRISING STRINGS OF MEMORY CELLS AND METHODS INCLUDING A METHOD USED IN FORMING A MEMORY ARRAY COMPRISING STRINGS OF MEMORY CELLS

(71) Applicant: Micron Technology, Inc., Boise, ID (US)

(72) Inventors: Lingyu Kong, Singapore (SG); Sok Han Wong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 616 days.

(21) Appl. No.: 17/348,460

(22) Filed: Jun. 15, 2021

(65) Prior Publication Data

US 2022/0399363 A1 Dec. 15, 2022

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ................................ H10B 43/27; H10B 41/27
See application file for complete search history.

(56) References Cited

U.S. PATENT DOCUMENTS

2014/0264882 A1 9/2014 Fest
2015/0054052 A1 2/2015 Lee et al.
(Continued)

FOREIGN PATENT DOCUMENTS

TW 202044491 12/2020
WO WO PCT/US2022/024895 12/2023

OTHER PUBLICATIONS

Scarbrough et al., U.S. Appl. No. 17/348,021, filed Jun. 15, 2021, titled "Integrated Circuitry Comprising a Memory Array Comprising Strings of Memory Cells and Methods Including a Method Used in Forming a Memory Array Comprising Strings of Memory Cells", 56 pages.

*Primary Examiner* — Nicholas J Tobergte
*Assistant Examiner* — Adin Hrnjic
(74) *Attorney, Agent, or Firm* — Wells St. John P.S.

(57) ABSTRACT

Integrated circuitry comprising a memory array comprises strings of memory cells comprising laterally-spaced memory blocks individually comprising a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises vertically alternating first tiers and second insulating tiers that are of different composition relative one another. The lower portion comprises an upper polysilicon-comprising layer, a lower polysilicon-comprising layer, an intervening-material layer vertically between the upper and lower polysilicon-comprising layers. An upper intermediate layer is vertically between the upper polysilicon-comprising layer and the intervening-material layer. A lower intermediate layer is vertically between the lower polysilicon-comprising layer and the intervening-material layer. The lower intermediate layer and the upper intermediate layer comprise at least one of (a), (b), and (c), where (a): $SiN_x$, where "x" is greater than 1.33 and no more than 2.0, or alternately where "x" is 0.5 to less than 1.33; (b): a bilayer comprising $SiN_y$ and comprising silicon dioxide positioned
(Continued)

vertically relative one another, where “y” is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, “z” being 0.5 to no more than 2.0. Methods are disclosed.

24 Claims, 14 Drawing Sheets

(56) References Cited

U.S. PATENT DOCUMENTS

| | | | | |
|---|---|---|---|---|
| 2016/0181271 | A1 | 6/2016 | Yada et al. | |
| 2017/0162594 | A1 | 6/2017 | Ahn | |
| 2017/0323954 | A1* | 11/2017 | Tsai | H10D 30/62 |
| 2018/0122906 | A1* | 5/2018 | Yu | H10B 41/27 |
| 2018/0138195 | A1* | 5/2018 | Lee | H01L 21/02639 |
| 2018/0315758 | A1* | 11/2018 | Yoo | H10B 41/27 |
| 2018/0366486 | A1 | 12/2018 | Hada et al. | |
| 2018/0374866 | A1 | 12/2018 | Makala et al. | |
| 2019/0287984 | A1 | 9/2019 | Yang et al. | |
| 2020/0176465 | A1* | 6/2020 | Tang | H10B 12/036 |
| 2020/0203370 | A1* | 6/2020 | Son | H10B 51/20 |
| 2020/0266203 | A1 | 8/2020 | Bhushan et al. | |
| 2020/0350203 | A1 | 11/2020 | Fratin et al. | |
| 2020/0403004 | A1 | 12/2020 | Chen et al. | |
| 2021/0305276 | A1* | 9/2021 | Kim | H10B 43/27 |

* cited by examiner

INTEGRATED CIRCUITRY COMPRISING A MEMORY ARRAY COMPRISING STRINGS OF MEMORY CELLS AND METHODS INCLUDING A METHOD USED IN FORMING A MEMORY ARRAY COMPRISING STRINGS OF MEMORY CELLS

TECHNICAL FIELD

Embodiments disclosed herein pertain to integrated circuitry comprising a memory array comprising strings of memory cells and to methods including, for example, a method used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a “0” or a “1”. In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called “stair-step structure” at an end or edge of an array of the vertically-stacked memory cells. The stair-step structure includes individual “stairs” (alternately termed “steps” or “stair-steps”) that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called “gate-last” or “replacement-gate” processing, so-called “gate-first” processing, and other processing whether existing or future-developed independent of when transistor gates are formed. Embodiments of the invention also encompass integrated circuitry comprising a memory array (e.g., NAND architecture) independent of method of manufacture. Example method embodiments are described with reference to FIGS. 1-28 which may be considered as a “gate-last” or “replacement-gate” process.

Figure 1:
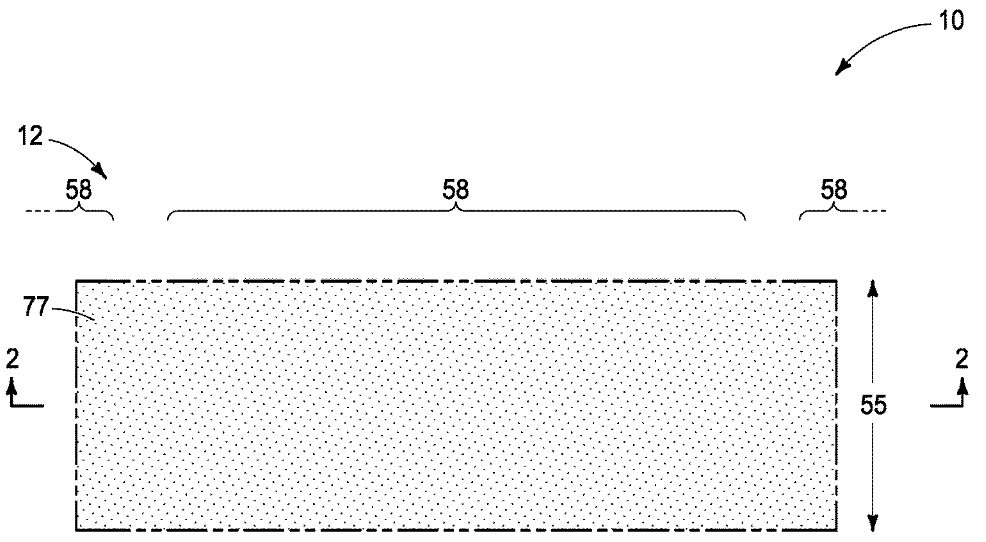
FIGS. 1-3 are diagrammatic cross-sectional views of portions of what will be an array of elevationally-extending strings of memory cells in accordance with an embodiment of the invention.
Figure 2:
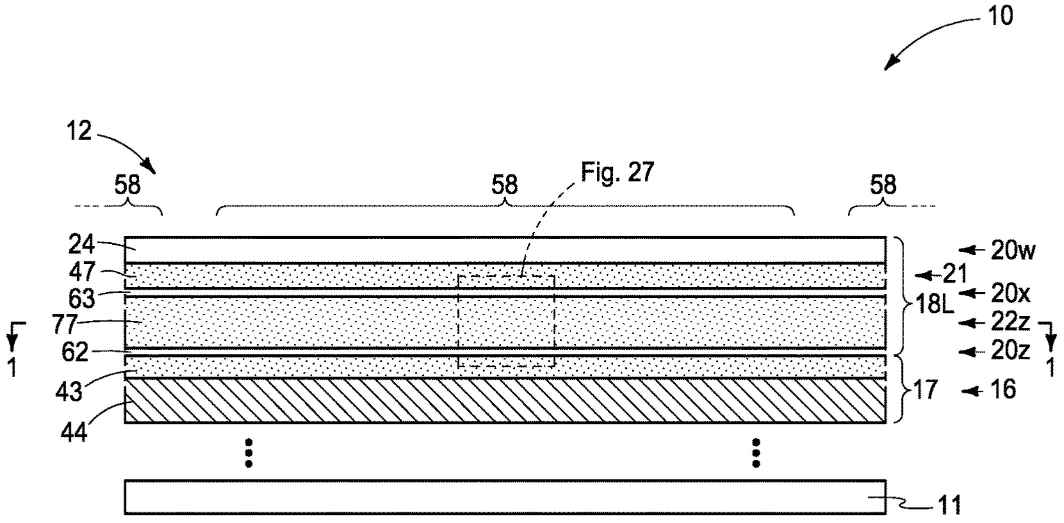
Figure 3:
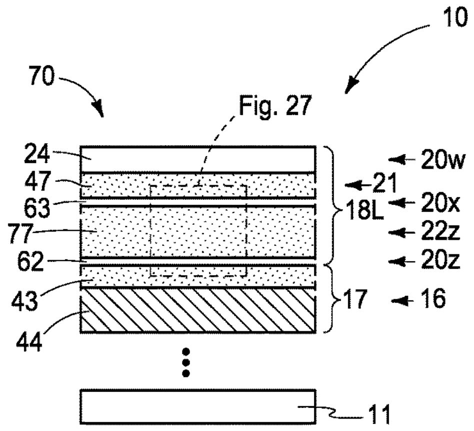
Figure 4:
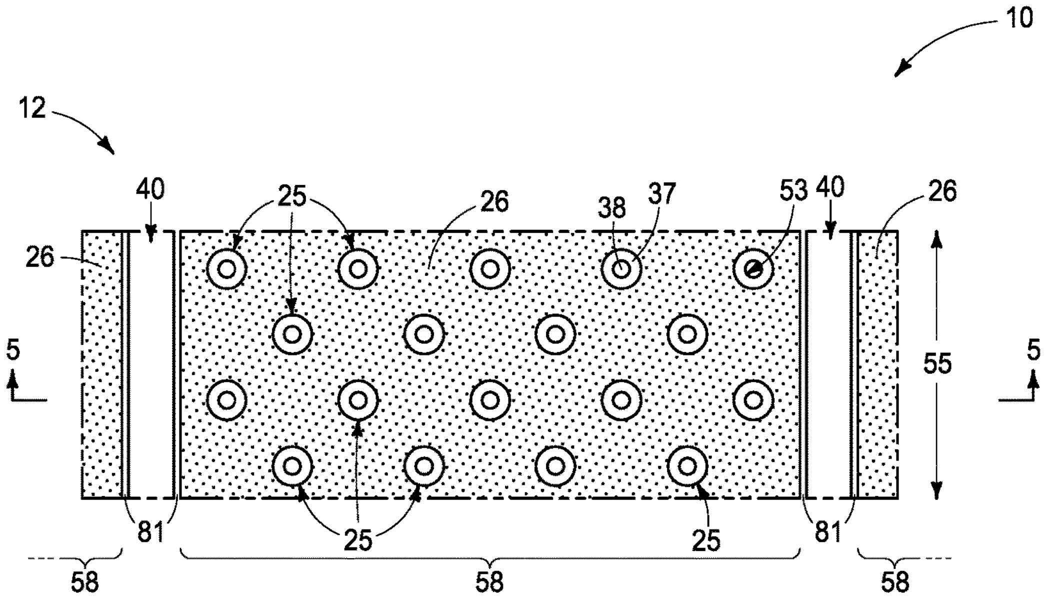
FIGS. 4-28 are diagrammatic sequential sectional and/or enlarged views of the construction of FIGS. 1-3, or portions thereof or alternate and/or additional embodiments, in process in accordance with some embodiments of the invention.
Figure 5:
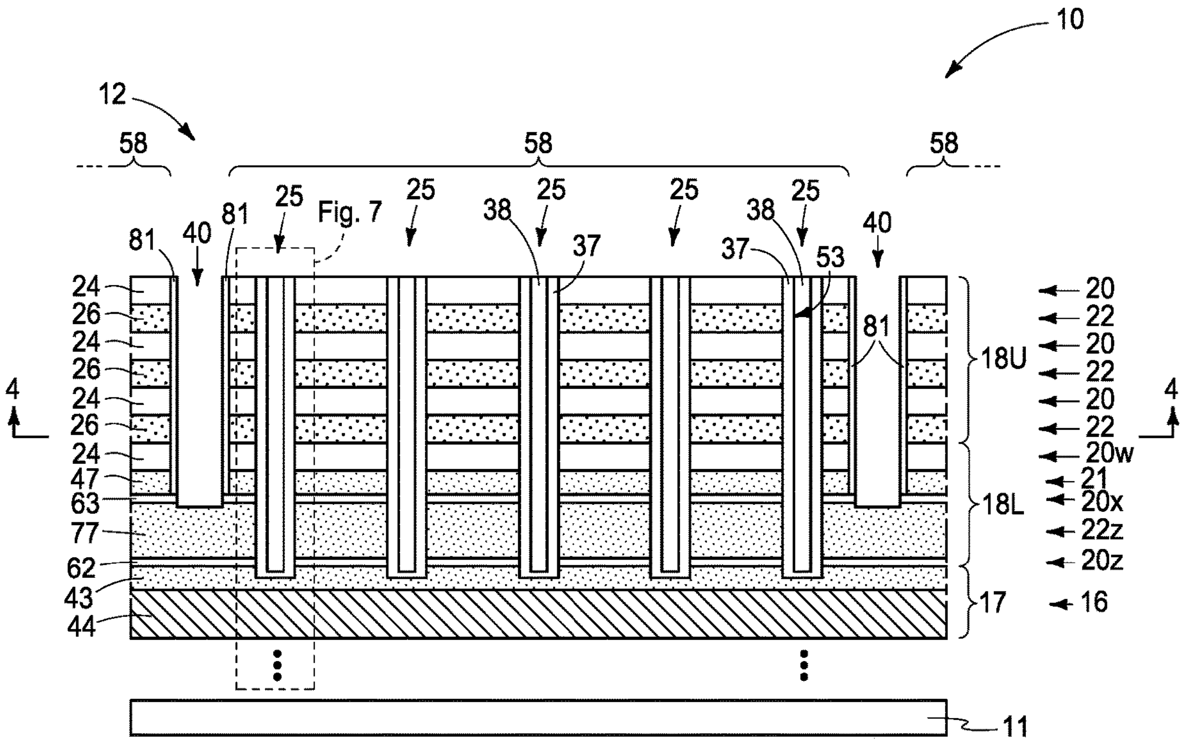
Figure 6:
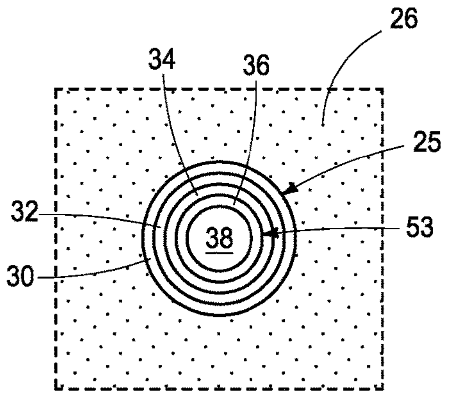
Figure 7:
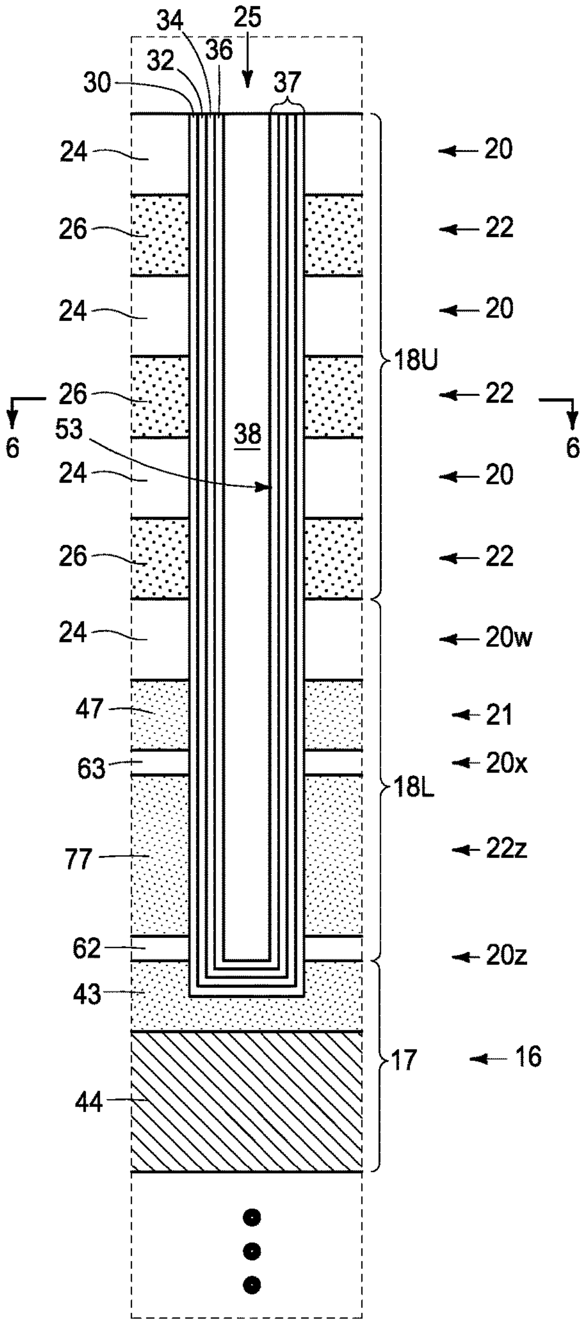

FIGS. 1-3 show a construction 10 having an array region 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within an array (e.g., array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tier(s) 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20*z* of second tiers 20* directly above (e.g., directly against) conductor material 17. Example lowest second tier 20*z* is insulative (e.g., comprising material 62) and may be sacrificial. A next-lowest second tier 20*x* of second tiers 20* is directly above lowest second tier 20*z* (e.g., comprising material 63). A lowest tier 22*z* of first tiers 22* comprising sacrificial material 77 (e.g., polysilicon or silicon nitride; e.g., in some embodiments referred to as an intervening-material layer) is vertically between lowest second tier 20*z* and next-lowest second tier 20*x*. In one embodiment, lower portion 18L comprises a conducting-material tier 21 comprising conducting material 47 (e.g., conductively-doped polysilicon) that is directly above next-lowest second tier 20*x*. In one embodiment, lower portion 18L comprises an uppermost tier, for example a next-next lowest second tier 20*w* (e.g., comprising material 24, for example silicon dioxide). Tiers 20*w* and 21 may be of the same or of different thickness(es) relative one another. Additional tiers may be present. For example, one or more additional tiers may be above tier 20*w* (tier 20*w* thereby not being the uppermost tier in portion 18L, and not shown), between tier 20*w* and tier 21 (not shown), and/or below tier 22*z* (other than 20*z* not being shown).

In some embodiments, material 47 may be considered as and referred to as an upper polysilicon-comprising layer, material 43 may be considered as and referred to as a lower polysilicon-comprising layer, and material 77 may be considered as and referred to as a sacrificial-material layer that is vertically between upper and lower polysilicon-comprising layers 47 and 43, respectively. In such embodiments, material 63 may be considered as and referred to as an upper intermediate layer that is vertically between upper polysilicon-comprising layer 47 and sacrificial-material layer 77 and material 62 may be considered as and referred to as a lower intermediate layer that is vertically between lower polysilicon-comprising layer 43 and sacrificial-material layer 77.

Material 62 of lowest second tier 20*z* and material 63 of next-lowest second tier 20*x* comprise at least one of (a), (b), and (c), where (a): $SiN_x$, where "x" is greater than 1.33 and no more than 2.0, or alternately where "x" is 0.5 to less than 1.33;

(b): a bilayer comprising $SiN_y$ and comprising silicon dioxide positioned vertically relative one another (such being of the same or of different thickness[es] relative one another), where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0.

In one embodiment, lowest second tier 20*z* and next-lowest second tier 20*x* comprise the (a), in one embodiment comprise the (b), and in one embodiment comprise the (c). In one embodiment, lowest second tier 20*z* and next-lowest second tier 20*x* have only one of the (a), the (b), and the (c), and in one such embodiment have the same one of the (a), the (b), and the (c). In one embodiment, lowest second tier 20*z* and next-lowest second tier 20*x* have different ones of the (a), the (b), and the (c). In one embodiment, at least one of lowest second tier 20*z* and next-lowest second tier 20*x* have at least two of the (a), the (b), and the (c). In one embodiment, at least one of lowest second tier 20*z* and next-lowest second tier 20*x* is directly against sacrificial material 77 of lowest first tier 22*z* and in one such embodiment as shown each of lowest second tier 20*z* and next-lowest second tier 20*x* is directly against sacrificial material 77 of lowest first tier 22*z*.

In one embodiment, lowest second tier 20*z* and next-lowest second tier 20*x* comprise the (a) and "x" is greater than 1.33 and in another such embodiment "x" is less than 1.33. In one embodiment, lowest second tier 20*z* and next-lowest second tier 20*x* comprise the (b) and "y" is greater than 1.33, in another such embodiment "y" is less than 1.33, and in still another such embodiment "y" is 1.33 (herein stoichiometric $Si_3N_4$). In one embodiment, lowest second tier 20*z* and next-lowest second tier 20*x* comprise the (c) and "z" is greater than 1.33, in another such embodiment "z" is less than 1.33, and in still another such embodiment "z" is 1.33. In one embodiment, lowest second tier 20*z* and next-lowest second tier 20*x* comprise the (c) and carbon is present at no more than 2.0 atomic percent.

Figure 8:
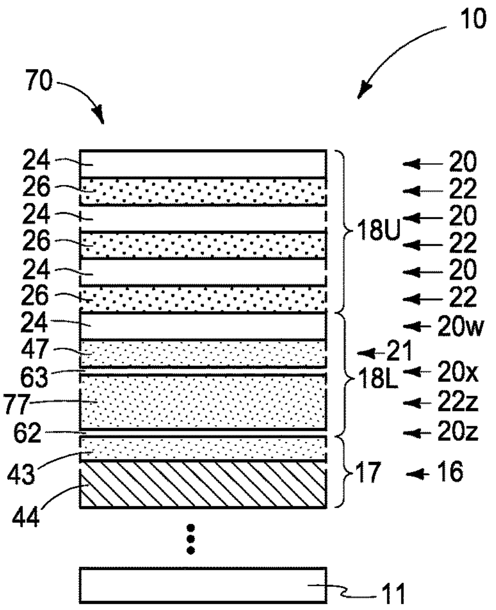

In some embodiments, construction 10 may be considered as comprising a first region (e.g., as shown by FIGS. 1 and 2) and a second region 70 aside the first region (e.g., as shown in FIG. 3). Second region 70 may be laterally-contacting the first region (not shown) or may be laterally-spaced from the first region (e.g., closely laterally there-adjacent but not touching, or laterally-far there-from and not touching). Second region 70 may be within one or more of the memory block regions (not shown). In some embodiments, construction 10 may be considered as comprising a first vertical stack (e.g., stack 18* in FIG. 2) and a second vertical stack (e.g., stack 18* in second region 70, with the second stack also comprising an upper portion 18U above lower portion 18L from subsequent processing as shown in FIG. 8).

Referring to FIGS. 4-8, an upper portion 18U of stack 18* has been formed above lower portion 18L. Upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a first tier 22 although such could alternately start with a second tier 20 (not shown). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through second tiers 20 and first tiers 22 in upper portion 18U to conductor tier 16 in lower portion 18L (e.g., at least to lowest first tier 22*z*) in lower portion 18L. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest second tier 20*z*. A reason for extending channel openings 25 at least to conductor material 17 of conductor tier 16 is to provide an anchoring effect to material that is within channel openings 25. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 4-7 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Horizontally-elongated trenches 40 have been formed (e.g., by anisotropic etching) into stack 18* through upper portion 18U and that extend through next-lowest second tier 20*x* to sacrificial material 77 of lowest first tier 22*z*. Trenches 40 are individually between immediately-laterally-adjacent memory-block regions 58. Trenches 40 may taper laterally-inward in vertical cross-section moving deeper into stack 18. By way of example and for brevity only, channel openings 25 are shown as being arranged in groups or columns of staggered rows of four and five channel openings 25 per row. Trenches 40 will typically be wider than channel openings 25 (e.g., 10 to 20 times wider, yet such wider degree not being shown for brevity). Any alternate existing or future-developed arrangement and construction may be used. Trenches 40 and channel openings 25 may be formed in any order relative the other or at the same time.

Trenches 40 as shown have been formed to extend to material 77 of lowest first tier 22*z*. As one example, trenches 40 may initially be formed by etching materials 24, 26, and 47 (likely using different anisotropic etching chemistries) and that stops on or within material 63 of next-lowest second tier 20*x*. A thin sacrificial liner 81 (e.g., hafnium oxide, aluminum oxide, etc.) may then be formed, followed by punch-etching there-through to expose material 63, and followed by punch-etching through material 63 to expose material 77. Alternately, and by way of example only, a sacrificial etch-stop line (not shown) having the same general horizontal outline as trenches 40 may individually be formed in conducting tier 21 (when present) directly above and in contact with material 63 of next-lowest second tier 20*x* before forming upper portion 18U. Trenches 40 may then be formed by etching materials 24 and 26 to stop on or within the material of the individual sacrificial lines, followed by exhuming remaining material of such sacrificial lines prior to forming thin sacrificial liner 81.

Ultimately, through horizontally-elongated trenches 40, sacrificial material 77 in lowest first tier 22*z* is replaced with conductive material that directly electrically couples together channel material 36 of channel-material strings 53 and conductor material 17 of conductor tier 16. Example methods of doing so are described with reference to FIGS. 9-20.

Figure 9:
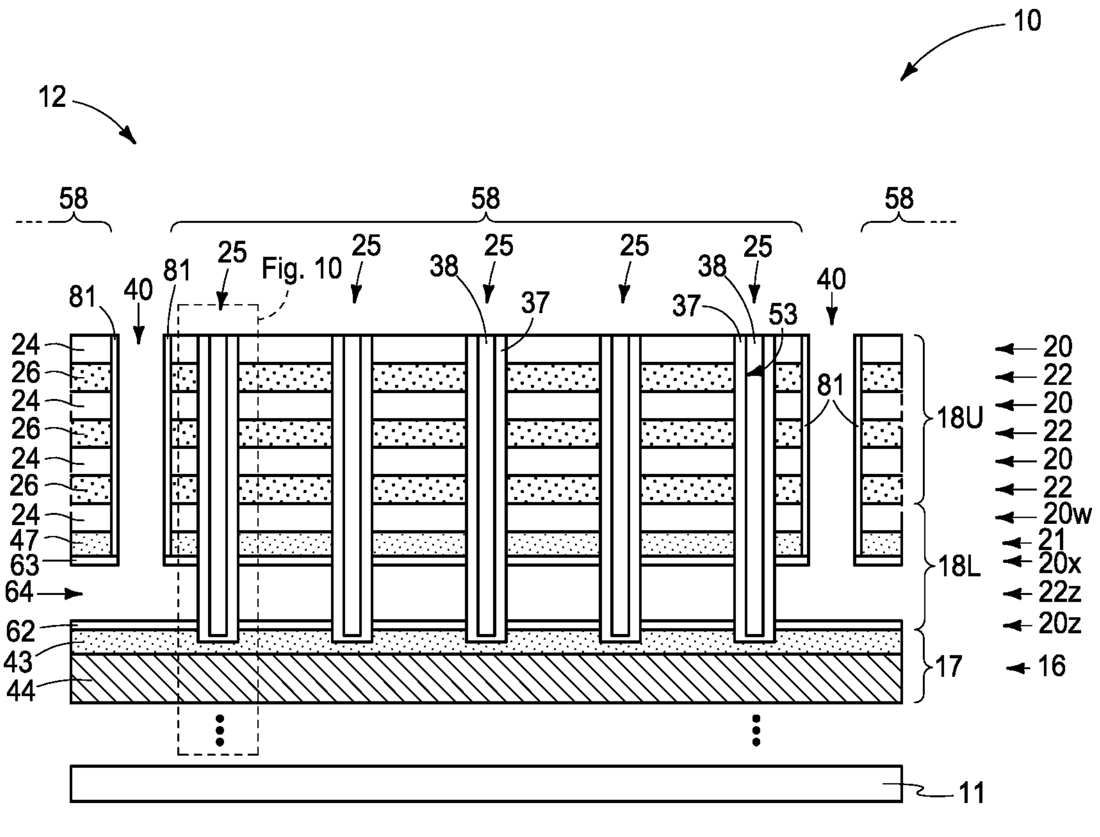
Figure 10:
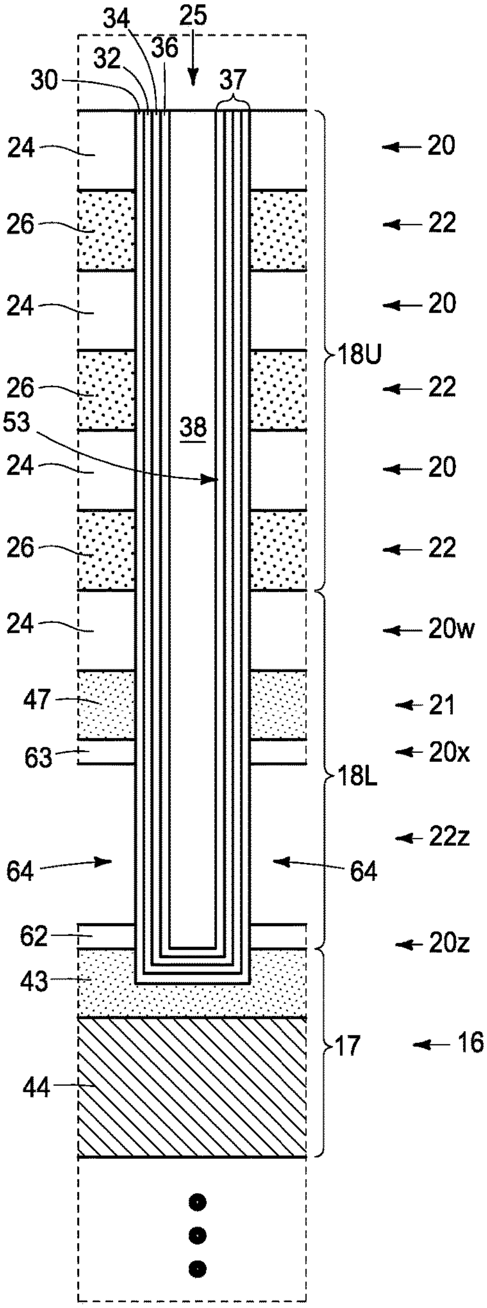
Figure 11:
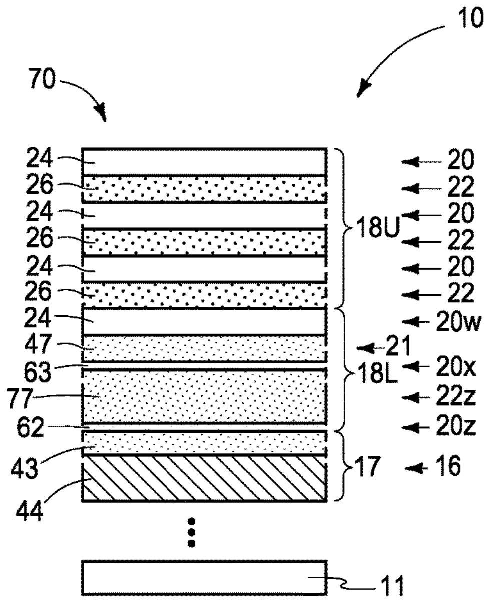

Referring to FIGS. 9-11, material 77 (not shown) has been removed from lowest first tier 22*z* through trenches 40, thus leaving or forming a void space 64 vertically between lowest second tier 20*z* and next-lowest second tier 20*x*. Such may occur, for example, by isotropic etching that is ideally conducted selectively relative to materials 62 and 63, for example using liquid or vapor $H_3PO_4$ as a primary etchant where material 77 is silicon nitride or using tetramethyl ammonium hydroxide [TMAH] where material 77 is polysilicon. In one embodiment and as shown, removal of material 77 has not occurred in second region 70.

Figure 12:
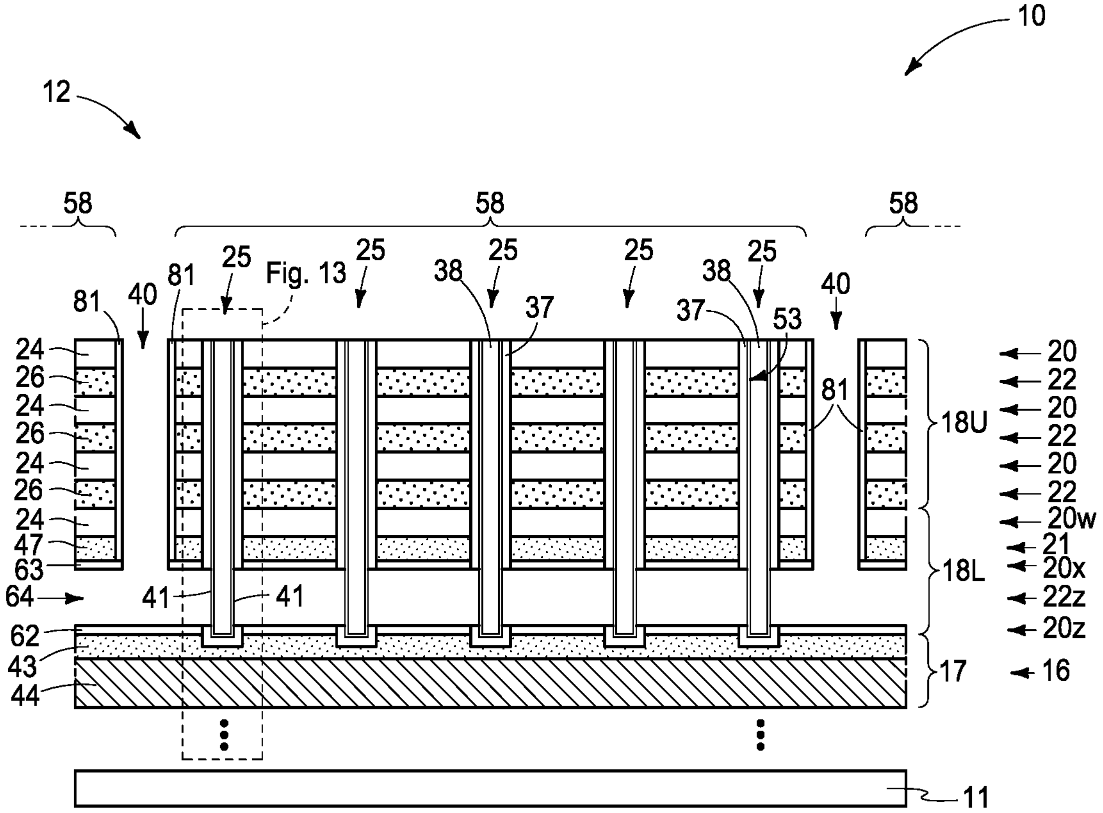
Figure 13:
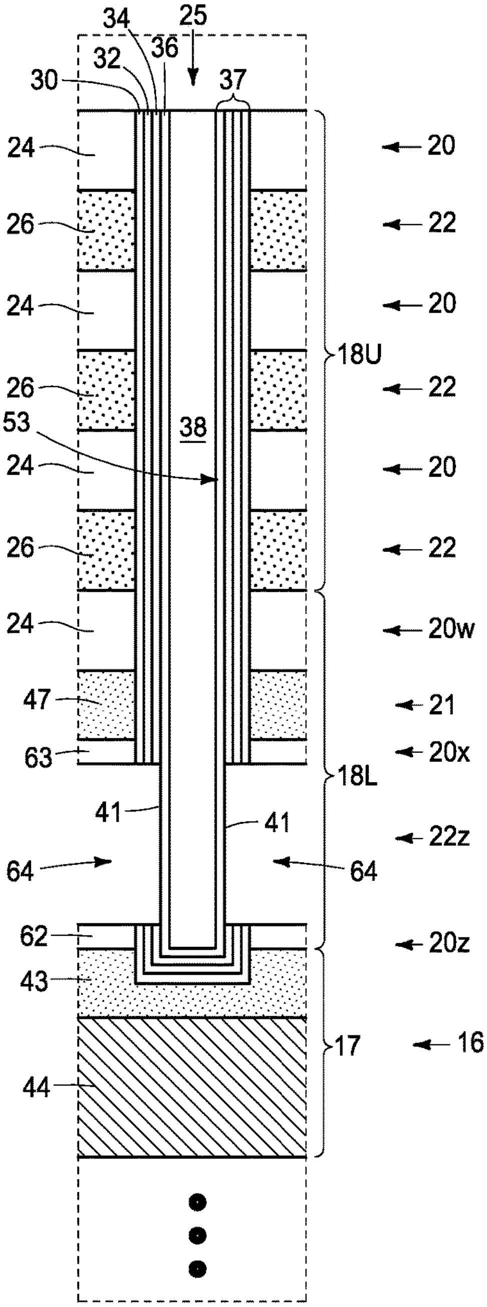
Figure 14:
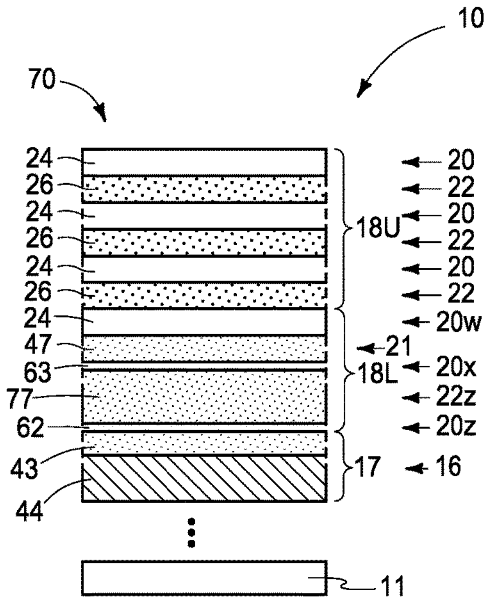

FIGS. 12-14 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22*z* to expose a sidewall 41 of channel material 36 of channel-material strings 53 in lowest first tier 22*z*. Any of materials 30, 32, and 34 in tier 22*z* may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction, with the example etching in one embodiment and as shown having been conducted selectively relative to materials 62 and 63 (and liner 81 in one embodiment when present). The artisan is capable of selecting other chemistries for etching other different materials where a construction as shown is desired. In one embodiment and as shown, the processing shown by FIGS. 12 and 13 (a first region) has not occurred in second region 70 in FIG. 14.

Figure 15:
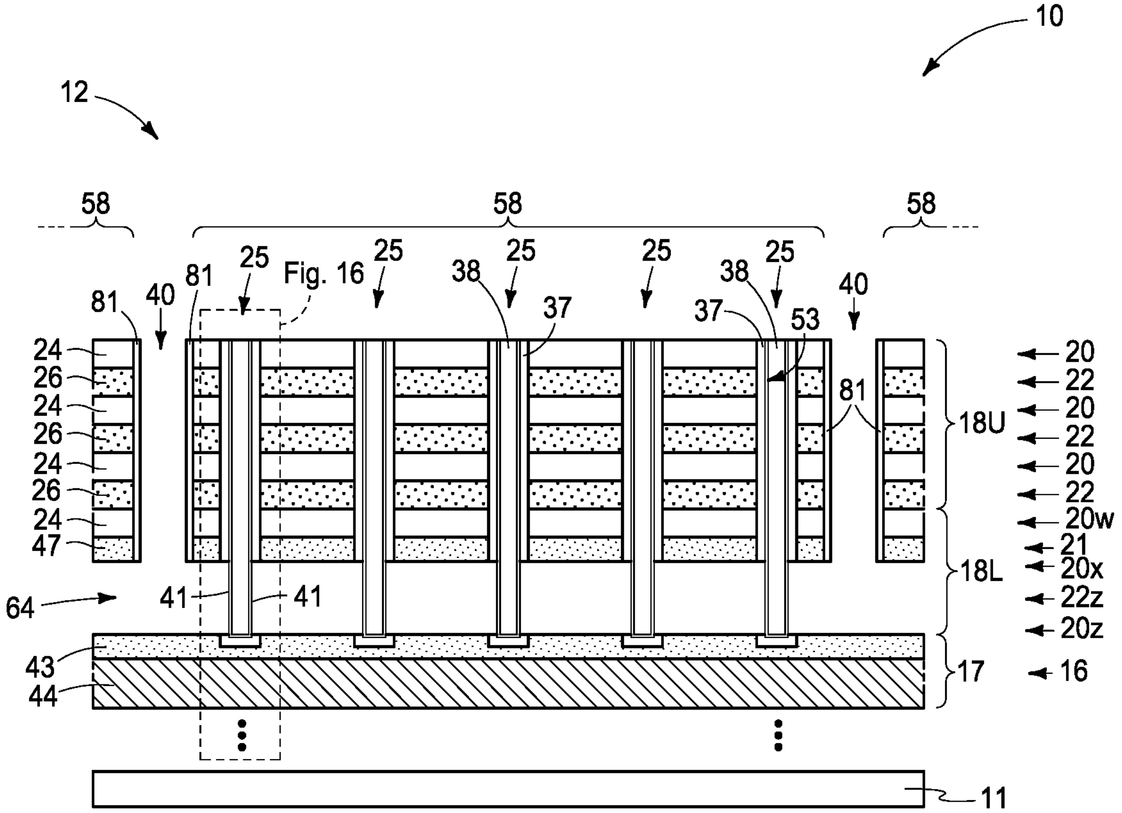
Figure 16:
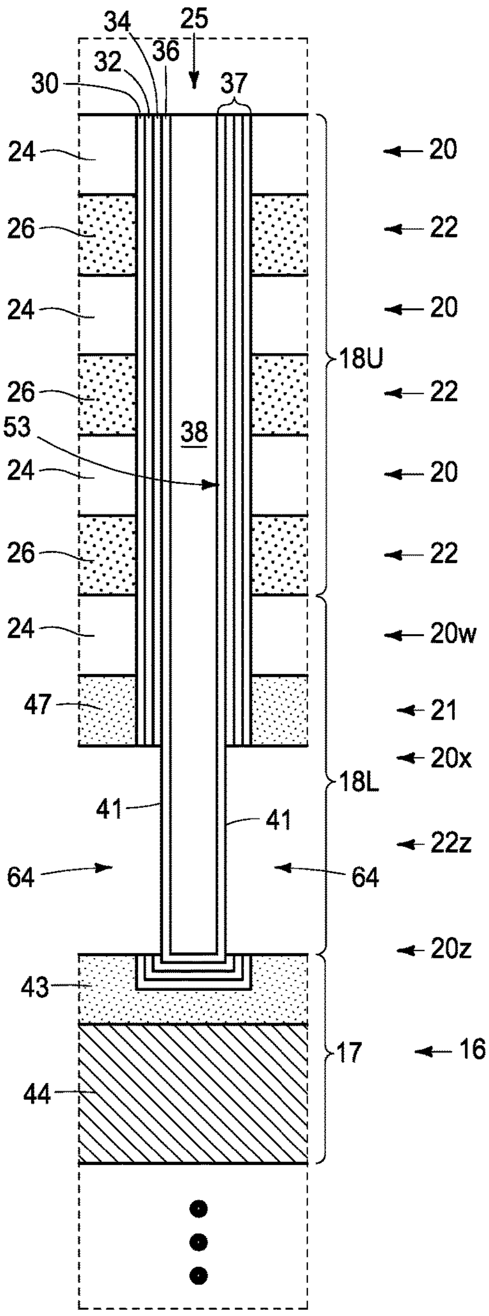
Figure 17:
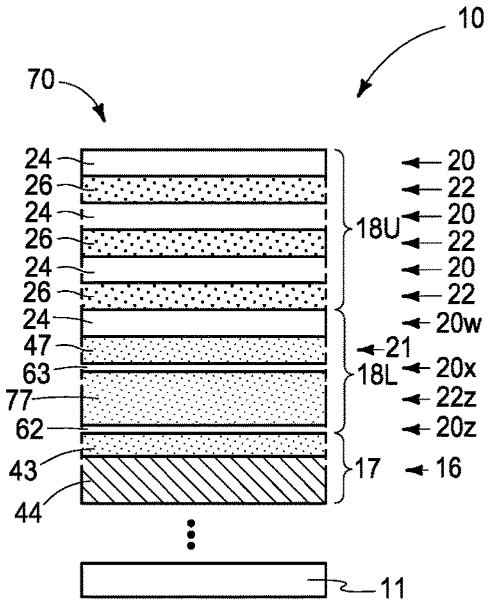

Some or all of the at least one of the (a), the (b), and the (c) may be removed from lowest second tier 20*z* and next-lowest second tier 20*x* when removing other materials, may be removed separately, or may partially or wholly remain in a finished circuit construction. The artisan is capable of selecting suitable etching chemistries depending on the desired result. By way of example, and in one embodiment, FIGS. 15 and 16 show all as having been removed by removal of all of materials 62 and 63 (not shown), thereby enlarging void space 64. In one embodiment and as shown, the processing shown by FIGS. 15 and 16 (a first region) has not occurred in second region 70 in FIG. 17.

Figure 27:
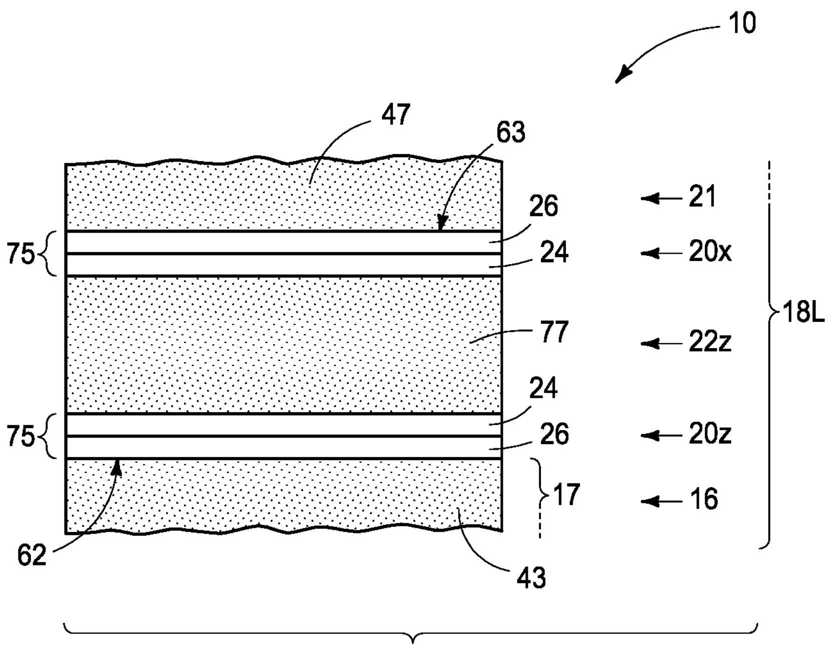
Figure 28:
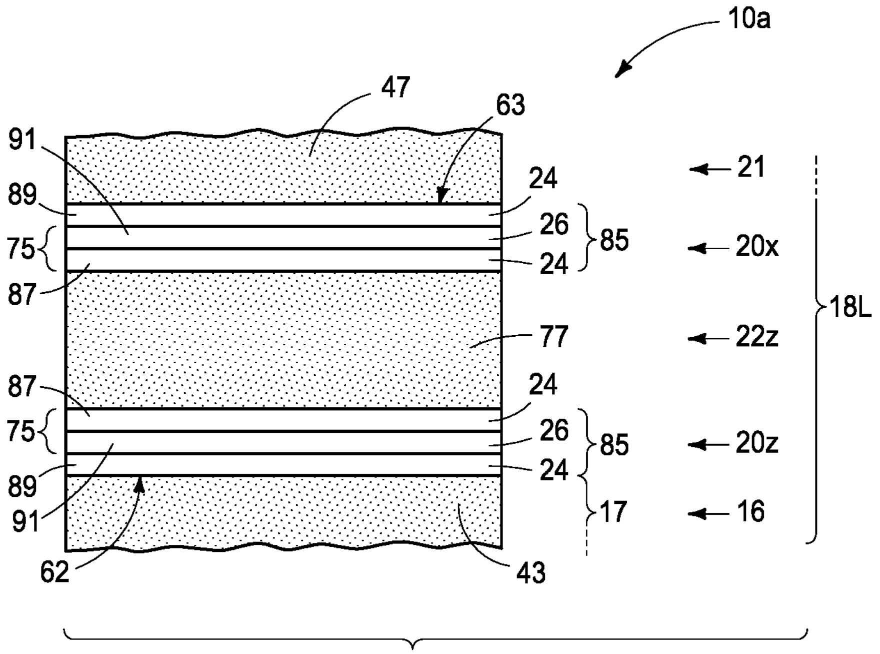

As stated above, one or both materials 62 and 63 in construction 10 may be the (b) (i.e., the bilayer), although and regardless of FIGS. 1-17 not showing either of materials 62 or 63 as comprising two or more layers for clarity and brevity. FIG. 27 is an enlarged view of a portion of either FIG. 2 or FIG. 3 showing lowest second tier 20*z* and next-lowest second tier 20*x* comprise the (b). Such shows materials 62 and 63 as each being an example bilayer 75 comprising $SiN_y$ 26 and comprising silicon dioxide 24 positioned vertically relative one another, with silicon dioxide 24 of bilayer 75 being closer to sacrificial material 77 of lowest first tier 22*z* than is $SiN_y$ 26. An alternate example embodiment is shown in FIG. 28 as an example construction 10*a* (corresponding to scale and positions of FIG. 27). Like numerals from the above-described embodiments have been used where appropriate, with some construction differences being indicated with the suffix "a" or with different numerals. In construction 10*a*, lowest second tier 20*z* and next-lowest second tier 20*x* comprise the (b) and the (b) comprises part of a trilayer 85. Silicon dioxide 24 comprises one layer 87 of silicon dioxide that is one of directly above or directly below $SiN_y$ 26. Trilayer 85 comprises another layer 89 of silicon dioxide 24 that is the other of directly above or directly below $SiN_y$ 26. $SiN_y$ 26 comprises a third layer 91 of trilayer 85 that is vertically between one and another layers 87 and 89, respectively, of silicon dioxide 24. Any other attribute(s) or aspect(s) as shown and/or described herein with respect to other embodiments may be used.

Figure 18:
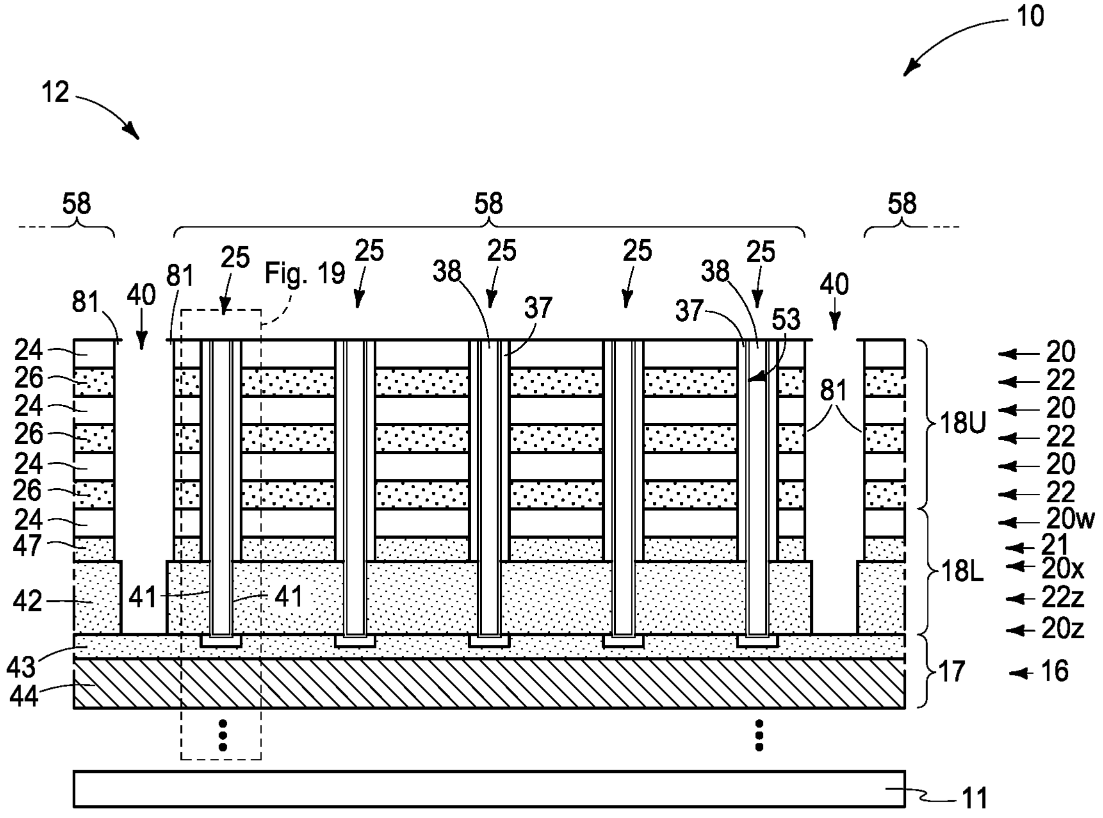
Figure 19:
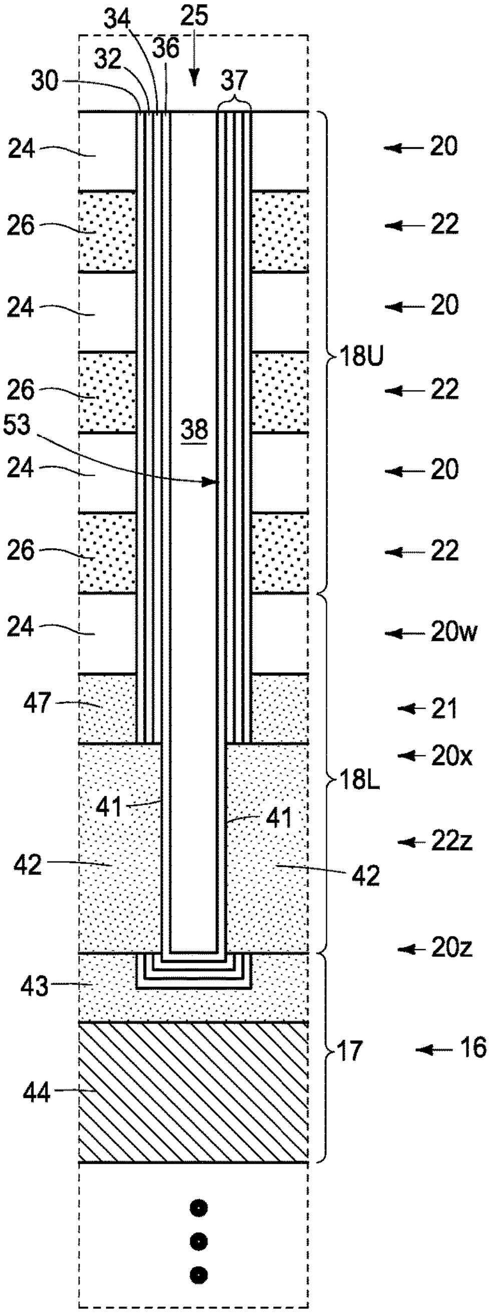
Figure 20:
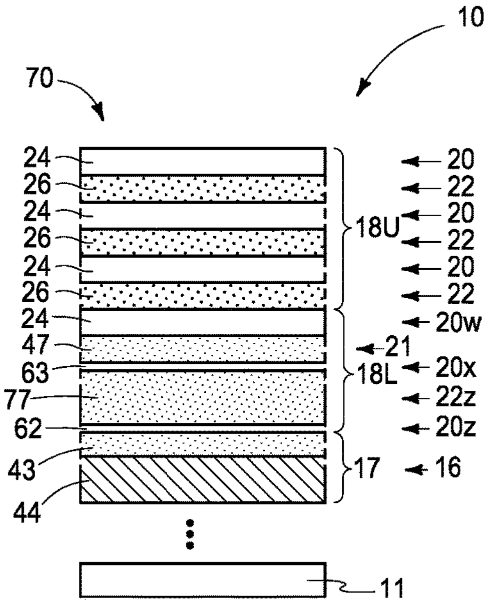
Figure 21:
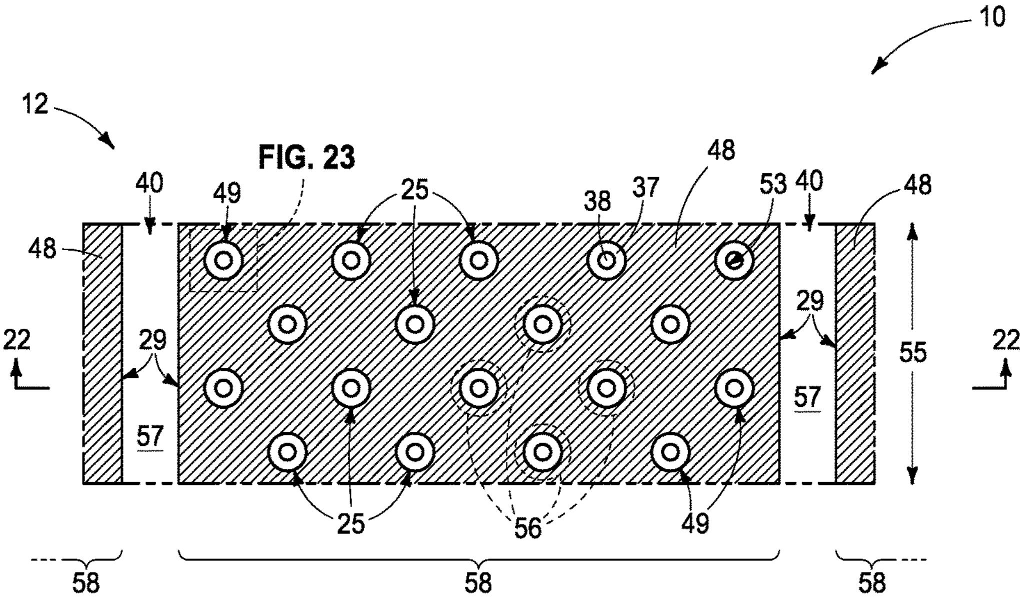
Figure 22:
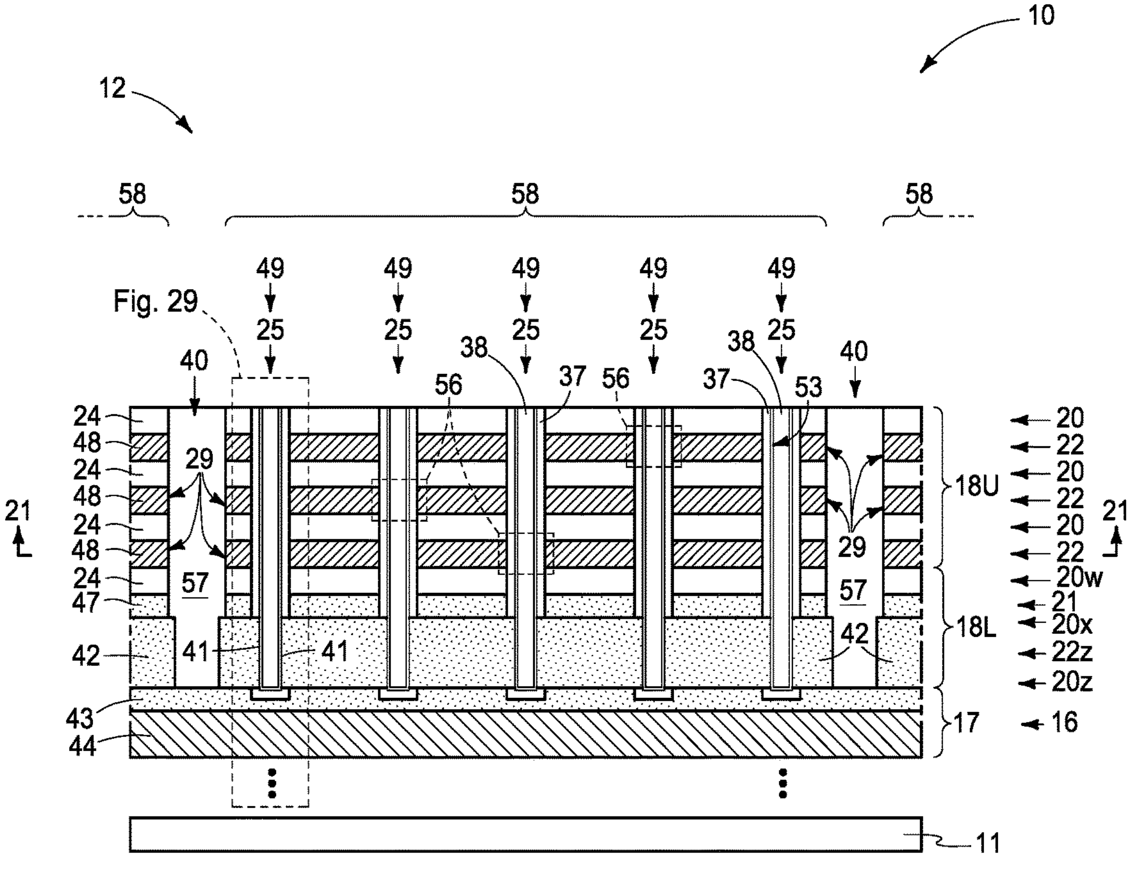
Figure 23:
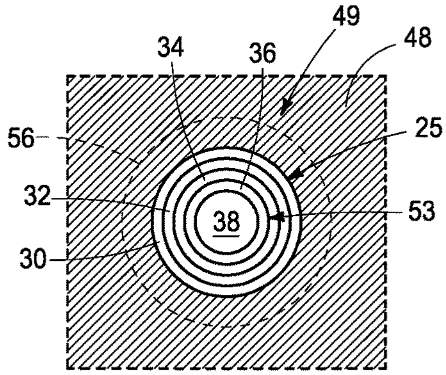
Figure 24:
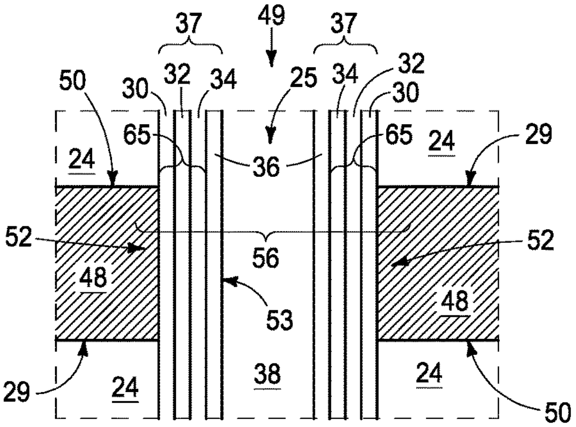

Referring to FIGS. 18-20, conducting material 42 (e.g., conductively-doped polysilicon) has been formed in lowest first tier 22*z* and in one embodiment directly against sidewall 41 of channel material 36. In one embodiment and as shown, such has been formed directly against a bottom of conducting material 47 of conducting tier 21 and directly against a top of conductor material 43 of conductor tier 16, thereby directly electrically coupling together channel material 36 of individual channel-material strings 53 with conductor material 43 of conductor tier 16 and conducting material 47 of conducting tier 21. Subsequently, and by way of example, conducting material 42 has been removed from trenches 40 as has sacrificial liner 81 (not shown). Sacrificial liner 81 may be removed before forming conducting material 42 (not shown). If some of the (a), the (b), and/or the (c) of material 62 remains whereby conducting material is not directly against a top of conductor material 43 within memory-block regions 58 (not shown), conducting material 42 can be left at the bottoms of trenches 40 (not shown) to directly electrically couple together materials 36 and 43 in a finished construction. In one embodiment and as shown, the processing shown by FIGS. 18 and 19 (a first region) has not occurred in second region 70 in FIG. 20.

Any other attribute(s) or aspect(s) as shown and/or described herein with respect to other embodiments may be used.

Referring to FIGS. 21-26, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, the lowest surface of channel material 36 of operative channel-material strings 53 is never directly against any of conductor material 17 of conductor tier 16.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped" is a material having from 0 atoms/$cm^3$ to $1\times10^{12}$ atoms/$cm^3$ of atoms of conductivity-increasing impurity in said material. In this document, "doped" is a material having more than $1\times10^{12}$ atoms/$cm^3$ of atoms of conductivity-increasing impurity therein and "conductively-doped" is material having at least $1\times10^{18}$ atoms/$cm^3$ of atoms of conductivity-increasing impurity therein. Intervening material 57 may include through array vias (not shown).

Figure 26:
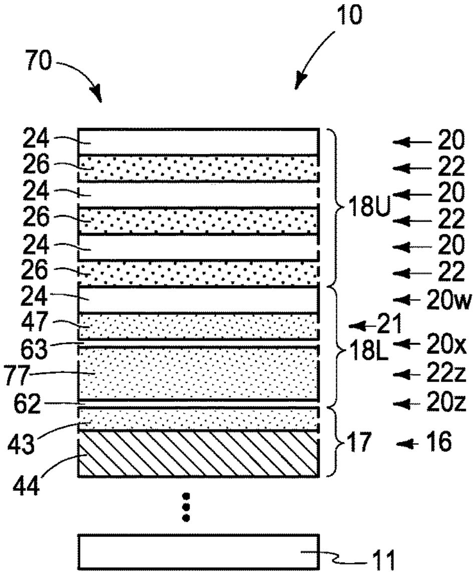
Figure 25:
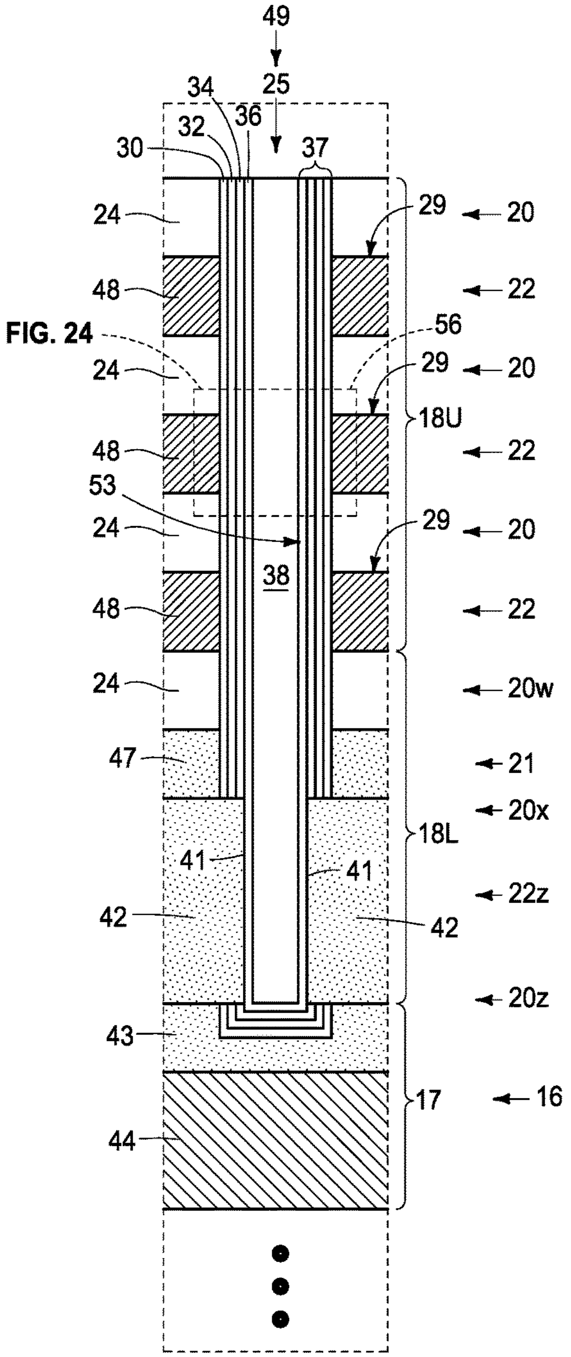

In one embodiment and as shown, the forming of conducting material 48 occurs with respect to the first vertical stack 18* in a first region (FIGS. 21 and 22) and not with respect to the second vertical stack 18* in second region 70 (FIG. 26).

Any other attribute(s) or aspect(s) as shown and/or described herein with respect to other embodiments may be used in the embodiments shown and described with reference to the above embodiments.

Some embodiments of the invention include methods regardless of whether forming a memory array and if forming a memory array regardless of whether such comprises strings of memory cells. An embodiment of the invention comprises a method comprising forming a stack (e.g., 18*) comprising an upper polysilicon-comprising layer (e.g., 47), a lower polysilicon-comprising layer (e.g., 43), a sacrificial-material layer (e.g., 77) vertically between the upper and lower polysilicon-comprising layers, an upper intermediate layer (e.g., 63) vertically between the upper polysilicon-comprising layer and the sacrificial-material layer, and a lower intermediate layer (e.g., 62) vertically between the lower polysilicon-comprising layer and the sacrificial-material layer. The lower intermediate layer and the upper intermediate layer comprise at least one of (a), (b), and (c), where

- (a): $SiN_x$, where "x" is greater than 1.33 and no more than 2.0, or alternately where "x" is 0.5 to less than 1.33;
- (b): a bilayer comprising $SiN_y$ and comprising silicon dioxide positioned vertically relative one another (such being of the same or of different thickness[es] relative one another), where "y" is 0.5 to no more than 2.0, the silicon dioxide of the bilayer being closer to the sacrificial material of the lowest first tier than is the $SiN_y$; and
- (c): carbon-doped $SiN_z$ having carbon present at 0.1 to 10.0 atomic percent, "z" being 0.5 to no more than 2.0.

An opening (e.g., 40) is formed through the upper polysilicon-comprising layer and the upper intermediate layer to the sacrificial-material layer. Through the opening, the sacrificial material of the sacrificial-material layer is selectively etched relative to the at least one of the (a), (b), and (c) to leave a void space (e.g., 64) vertically between the upper and the lower intermediate layers. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, integrated circuitry (e.g., 10) comprising a memory array (e.g., 12) comprising strings (e.g., 49) of memory cells (e.g., 56) comprises laterally-spaced memory blocks (e.g., 58) individually comprising a first vertical stack (e.g., 18* in FIGS. 21 and 22) comprising alternating insulative tiers (e.g., 20) and conductive tiers (e.g., 22). Strings (e.g., 49) of memory cells (e.g., 56) comprising channel-material strings (e.g., 53) extend through the insulative tiers and the conductive tiers. The conductive tiers individually comprise a horizontally-elongated conductive line (e.g., 29). A second vertical stack (e.g., 18* in FIG. 26) is aside the first vertical stack. The second vertical stack comprises an upper portion (e.g., 18U) and a lower portion (e.g., 18L). The upper portion comprises vertically alternating first tiers (e.g., 22 in FIG. 26) and second insulating tiers (e.g., 20 in FIG. 26) that are of different composition relative one another.

The lower portion comprises
- an upper polysilicon-comprising layer (e.g., 47);
- a lower polysilicon-comprising layer (e.g., 43);
- an intervening-material layer (e.g., 77) vertically between the upper and lower polysilicon-comprising layers;
- an upper intermediate layer (e.g., 63) vertically between the upper polysilicon-comprising layer and the intervening-material layer;
- a lower intermediate layer (e.g., 62) vertically between the lower polysilicon-comprising layer and the intervening-material layer;
- the lower intermediate layer and the upper intermediate layer comprise at least one of (a), (b), and (c), where
  - (a): $SiN_x$, where "x" is greater than 1.33 and no more than 2.0, or alternately where "x" is 0.5 to less than 1.33;
  - (b): a bilayer comprising $SiN_y$ and comprising silicon dioxide positioned vertically relative one another (such being of the same or of different thickness[es] relative one another), where "y" is 0.5 to no more than 2.0, the silicon dioxide of the bilayer being closer to the sacrificial material of the lowest first tier than is the $SiN_y$; and
  - (c): carbon-doped $SiN_z$ having carbon present at 0.1 to 10.0 atomic percent, "z" being 0.5 to no more than 2.0.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. The lower portion comprises a lowest of the second tiers. A next-lowest of the second tiers is directly above the lowest second tier. A lowest of the first tiers comprises sacrificial material vertically between the lowest second tier and the next-lowest second tier. The lowest second tier and the next-lowest second tier comprise at least one of (a), (b), and (c), where (a): $SiN_x$, where "x" is greater than 1.33 and no more than 2.0, or alternately where "x" is 0.5 to less than 1.33; (b): a bilayer comprising $SiN_y$ and comprising silicon dioxide positioned vertically relative one another, where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0. The vertically-alternating first tiers and second tiers of an upper portion of the stack are formed above the lower portion. Channel-material strings are formed that extend through the first tiers and the second tiers in the upper portion to the lowest first tier in the lower portion. Horizontally-elongated trenches are formed through the upper portion and that extend through the next-lowest second tier to the sacrificial material of the lowest first tier. The horizontally-elongated trenches are individually between immediately-laterally-adjacent of the memory-block regions. Through the horizontally-elongated trenches, the sacrificial material in the lowest first tier is replaced with conductive material that directly electrically couples together channel material of the channel-material strings and the conductor material of the conductor tier.

In some embodiments, a method comprises forming a stack comprising an upper polysilicon-comprising layer, a lower polysilicon-comprising layer, a sacrificial-material layer vertically between the upper and lower polysilicon-comprising layers. An upper intermediate layer is vertically between the upper polysilicon-comprising layer and the sacrificial-material layer and a lower intermediate layer is vertically between the lower polysilicon-comprising layer and the sacrificial-material layer. The lower intermediate layer and the upper intermediate layer comprise at least one of (a), (b), and (c), where (a): $SiN_x$, where "x" is greater than 1.33 and no more than 2.0, or alternately where "x" is 0.5 to less than 1.33; (b): a bilayer comprising $SiN_y$ and comprising silicon dioxide positioned vertically relative one another, where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0. An opening is formed through the upper polysilicon-comprising layer and the upper intermediate layer to the sacrificial-material layer. Through the opening, the sacrificial material of the sacrificial-material layer is selectively etched relative to the at least one of the (a), (b), and (c) to leave a void space vertically between the upper and the lower intermediate layers.

In some embodiments, integrated circuitry comprising a memory array comprises strings of memory cells comprising laterally-spaced memory blocks individually comprising a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises vertically alternating first tiers and second insulating tiers that are of different composition relative one another. The lower portion comprises an upper polysilicon-comprising layer, a lower polysilicon-comprising layer, an intervening-material layer vertically between the upper and lower polysilicon-comprising layers. An upper intermediate layer is vertically between the upper polysilicon-comprising layer and the intervening-material layer. A lower intermediate layer is vertically between the lower polysilicon-comprising layer and the intervening-material layer. The lower intermediate layer and the upper intermediate layer comprise at least one of (a), (b), and (c), where (a): $SiN_x$, where "x" is greater than 1.33 and no more than 2.0, or alternately where "x" is 0.5 to less than 1.33; (b): a bilayer comprising $SiN_y$ and comprising silicon dioxide positioned vertically relative one another, where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:

forming a conductor tier comprising conductor material on a substrate, the conductor material having a conductively doped semiconductive material region over a metal silicide region;

forming a lower portion of a stack that will comprise vertically-alternating first tiers and second tiers above the conductor tier, the stack comprising laterally-spaced memory-block regions, material of the first tiers being of different composition from material of the second tiers, the lower portion consisting of:

a lowest of the second tiers directly on the conductor material;

a next-lowest of the second tiers directly above the lowest second tier;

a lowest of the first tiers comprising sacrificial material vertically between the lowest second tier and the next-lowest second tier;

a conductive material tier directly on the next lowest of the second tiers;

an uppermost second tier directly on the conductive material tier; and one of the lowest second tier and the next-lowest second tier consisting of (a) and the other of the lowest second tier and the next-lowest second tier consisting of (b) or (c), where (a): $SiN_x$, where "x" is greater than 1.33 and no more than 2.0, or alternately where "x" is 0.5 to less than 1.33;

(b): a bilayer comprising $SiN_y$ and comprising silicon dioxide positioned vertically relative one another, where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0;

forming vertically-alternating first tiers and second tiers of an upper portion of the stack above and in direct physical contact with the uppermost second tier of the lower portion, and forming channel-material strings that extend through the first tiers and the second tiers in the upper portion to the lowest first tier in the lower portion;

forming horizontally-elongated trenches through the upper portion and that extend through the next-lowest second tier to the sacrificial material of the lowest first tier, the horizontally-elongated trenches individually being between immediately-laterally-adjacent of the memory-block regions;

through the horizontally-elongated trenches, replacing the sacrificial material in the lowest first tier with conductive material that directly electrically couples together channel material of the channel-material strings and the conductor material of the conductor tier;

removing only some of the (a), the (b), and the (c) from each of the lowest second tier and the next-lowest second tier before the replacing that forms the conductive material, a remaining portion of the (a), the (b), and the (c) in the next-lowest second tier remaining directly above a remaining portion of the at least one of the (a), the (b), and the (c) in the lowest second tier laterally outside of the memory-block regions during and after the replacing;

after the replacing and prior to subsequent processing, removing the conductive material from within the horizontally-elongated trenches to expose the conductor tier; and forming an isolation material within the horizontally-elongated trenches and in direct physical contact with an upper surface of the conductor tier along a bottom of the trenches.

2. The method of claim 1 wherein "x" is greater than 1.33.

3. The method of claim 1 wherein "x" is less than 1.33.

4. The method of claim 1 wherein the lowest second tier and the next-lowest second tier comprise the (b).

5. The method of claim 4 wherein "y" is 1.33.

6. The method of claim 4 wherein "y" is less than 1.33.

7. The method of claim 4 wherein "y" is greater than 1.33.

8. The method of claim 1 wherein the other of the lowest second tier and the next-lowest second tier consists of the (c).

9. The method of claim 8 wherein the carbon is present at no more than 2.0 atomic percent.

10. The method of claim 8 wherein "z" is 1.33.

11. The method of claim 8 wherein "z" is less than 1.33.

12. The method of claim 8 wherein "z" is greater than 1.33.

13. A method used in forming a memory array comprising strings of memory cells, comprising:

forming a conductor tier comprising conductor material on a substrate, the conductor material having a conductively doped semiconductive material region over a metal silicide region;

forming a lower portion of a stack that will comprise vertically-alternating first tiers and second tiers above the conductor tier, the stack comprising laterally-spaced memory-block regions, material of the first tiers being of different composition from material of the second tiers, the lower portion consisting of:

a lowest of the second tiers directly on the conductor material;

a next-lowest of the second tiers directly above the lowest second tier;

a lowest of the first tiers comprising sacrificial material vertically between the lowest second tier and the next-lowest second tier;

a conductive material tier directly on the next lowest of the second tiers;

an uppermost second tier directly on the conductive material tier; and one of the lowest second tier and the next-lowest second tier consisting of one of (a), (b), and (c), and the other of the lowest second tier and the next-lowest second tier consisting of (b) or (c), where (a): $SiN_x$, where "x" is greater than 1.33 and no more than 2.0, or alternately where "x" is 0.5 to less than 1.33;

(b): a bilayer comprising $SiN_y$ and comprising silicon dioxide positioned vertically relative one another, where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0;

wherein the lowest second tier and the next-lowest second tier have different ones of the (a), the (b), and the (c);

forming vertically-alternating first tiers and second tiers of an upper portion of the stack above and in direct physical contact with the uppermost second tier of the lower portion, and forming channel-material strings that extend through the first tiers and the second tiers in the upper portion to the lowest first tier in the lower portion;

forming horizontally-elongated trenches through the upper portion and that extend through the next-lowest second tier to the sacrificial material of the lowest first tier, the horizontally-elongated trenches individually being between immediately-laterally-adjacent of the memory-block regions;

through the horizontally-elongated trenches, replacing the sacrificial material in the lowest first tier with conductive material that directly electrically couples together channel material of the channel-material strings and the conductor material of the conductor tier;

removing only some of the at least one of the (a), the (b), and the (c) from each of the lowest second tier and the next-lowest second tier before the replacing that forms the conductive material, a remaining portion of the at least one of the (a), the (b), and the (c) in the next-lowest second tier remaining directly above a remaining portion of the at least one of the (a), the (b), and the (c) in the lowest second tier laterally outside of the memory-block regions during and after the replacing;

after the replacing and prior to subsequent processing, removing the conductive material from within the horizontally-elongated trenches to expose the conductor tier; and forming an isolation material within the horizontally-elongated trenches and in direct physical contact with an upper surface of the conductor tier along a bottom of the trenches.

14. The method of claim 13 wherein at least one of the lowest second tier and the next-lowest second tier is directly against the sacrificial material of the lowest first tier.

15. The method of claim 14 wherein each of the lowest second tier and the next-lowest second tier is directly against the sacrificial material of the lowest first tier.

16. A method used in forming a memory array comprising strings of memory cells, comprising:

forming a conductor tier comprising conductor material on a substrate, the conductor material containing conductively doped semiconductive material and metal silicide;

forming a lower portion of a first vertical stack that will comprise vertically-alternating first tiers and second tiers above the conductor tier, the first vertical stack comprising laterally-spaced memory-block regions, material of the first tiers being of different composition from material of the second tiers;

forming a lower portion of a second vertical stack that will comprise vertically-alternating first tiers and second tiers above the conductor tier, the second vertical stack being aside the first vertical stack, the lower portion in each of the first and second vertical stacks comprising:

a lowest of the second tiers;

a next-lowest of the second tiers directly above the lowest second tier;

a lowest of the first tiers comprising sacrificial material vertically between the lowest second tier and the next-lowest second tier; and one of the lowest second tier and the next-lowest second tier consisting of one of (a), (b), and (c), and the other of the lowest second tier and the next-lowest second tier consisting of (b) or (c), where (a): $SiN_x$, where "x" is greater than 1.33 and no more than 2.0, or alternately where "x" is 0.5 to less than 1.33;

(b): a bilayer comprising $SiN_y$ and comprising silicon dioxide positioned vertically relative one another, where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0;

forming vertically-alternating first tiers and second tiers of an upper portion of each of the first and second vertical stacks above its lower portion, and forming channel-material strings that extend through the first tiers and the second tiers in the upper portion in the first vertical stack to the lowest first tier in the lower portion in the first vertical stack;

forming horizontally-elongated trenches through the upper portion of the first vertical stack and that extend through the next-lowest second tier to the sacrificial material of the lowest first tier in the first vertical stack, the horizontally-elongated trenches individually being between immediately-laterally-adjacent of the memory-block regions in the first vertical stack;

through the horizontally-elongated trenches, replacing the sacrificial material in the lowest first tier with conductive material that directly electrically couples together channel material of the channel-material strings and the conductor material of the conductor tier, the at least one of the (a), the (b), and the (c) of the lowest second tier and the next-lowest second tier having the sacrificial material there-between remaining in the second vertical stack in a finished construction of the integrated circuitry, the second vertical stack being laterally outside of the memory-block regions;

after the replacing and prior to subsequent processing, removing the conductive material from within the horizontally-elongated trenches to expose the conductor tier; and forming an isolation material within the horizontally-elongated trenches in direct physical contact with an upper surface of the conductor tier along a bottom of the trenches; wherein one of the lowest second tier and the next-lowest second tier comprise the (a).

17. The method of claim 16 comprising, in the finished construction of the integrated circuitry:

an upper polysilicon-comprising layer above and directly against the next-lowest second tier; and a lower polysilicon-comprising layer below and directly against the lowest second tier.

18. A method used in forming a memory array comprising strings of memory cells, comprising:

forming a conductor tier comprising conductor material on a substrate, the conductor material containing conductively doped semiconductive material and metal silicide;

forming a lower portion of a first vertical stack that will comprise vertically-alternating first tiers and second tiers above the conductor tier, the first vertical stack comprising laterally-spaced memory-block regions, material of the first tiers being of different composition from material of the second tiers;

forming a lower portion of a second vertical stack that will comprise vertically-alternating first tiers and second tiers above the conductor tier, the second vertical stack being aside the first vertical stack, the lower portion in each of the first and second vertical stacks comprising:

a lowest of the second tiers;

a next-lowest of the second tiers directly above the lowest second tier;

a lowest of the first tiers comprising sacrificial material vertically between the lowest second tier and the next-lowest second tier; and one of the lowest second tier and the next-lowest second tier consisting of one of (a), (b), and (c), and the other of the lowest second tier and the next-lowest second tier consisting of (b) or (c), where (a): $SiN_x$, where "x" is greater than 1.33 and no more than 2.0, or alternately where "x" is 0.5 to less than 1.33;

(b): a bilayer comprising $SiN_y$ and comprising silicon dioxide positioned vertically relative one another, where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0;

forming vertically-alternating first tiers and second tiers of an upper portion of each of the first and second vertical stacks above its lower portion, and forming channel-material strings that extend through the first tiers and the second tiers in the upper portion in the first vertical stack to the lowest first tier in the lower portion in the first vertical stack;

forming horizontally-elongated trenches through the upper portion of the first vertical stack and that extend through the next-lowest second tier to the sacrificial material of the lowest first tier in the first vertical stack, the horizontally-elongated trenches individually being between immediately-laterally-adjacent of the memory-block regions in the first vertical stack;

through the horizontally-elongated trenches, replacing the sacrificial material in the lowest first tier with conductive material that directly electrically couples together channel material of the channel-material strings and the conductor material of the conductor tier, the at least one of the (a), the (b), and the (c) of the lowest second tier and the next-lowest second tier having the sacrificial material there-between remaining in the second vertical stack in a finished construction of the integrated circuitry, the second vertical stack being laterally outside of the memory-block regions;

after the replacing and prior to subsequent processing, removing the conductive material from within the horizontally-elongated trenches to expose the conductor tier; and forming an isolation material within the horizontally-elongated trenches in direct physical contact with an upper surface of the conductor tier along a bottom of the trenches, wherein the lowest second tier and the next-lowest second tier comprise the (b).

19. The method of claim 18 wherein the (b) comprises part of a trilayer, the silicon dioxide comprising one layer of silicon dioxide that is one of directly above or directly below the $SiN_y$, the trilayer comprising another layer of silicon dioxide the other of directly above or directly below the $SiN_y$, the $SiN_y$ comprising a third layer of the trilayer that is vertically between the one and another layers of silicon dioxide.

20. A method used in forming a memory array comprising strings of memory cells, comprising:

forming a conductor tier comprising conductor material on a substrate, the conductor material containing conductively doped semiconductive material and metal silicide;

forming a lower portion of a first vertical stack that will comprise vertically-alternating first tiers and second tiers above the conductor tier, the first vertical stack comprising laterally-spaced memory-block regions, material of the first tiers being of different composition from material of the second tiers;

forming a lower portion of a second vertical stack that will comprise vertically-alternating first tiers and second tiers above the conductor tier, the second vertical stack being aside the first vertical stack, the lower portion in each of the first and second vertical stacks comprising:

a lowest of the second tiers;

a next-lowest of the second tiers directly above the lowest second tier;

a lowest of the first tiers comprising sacrificial material vertically between the lowest second tier and the next-lowest second tier; and one of the lowest second tier and the next-lowest second tier consisting of one of (a), (b), and (c), and the other of the lowest second tier and the next-lowest second tier consisting of (b) or (c), where (a): $SiN_x$, where "x" is greater than 1.33 and no more than 2.0, or alternately where "x" is 0.5 to less than 1.33;

(b): a bilayer comprising $SiN_y$ and comprising silicon dioxide positioned vertically relative one another, where "y" is 0.5 to no more than 2.0, the silicon dioxide of the bilayer being closer to the sacrificial material of the lowest first tier than is the $SiN_y$; and (c): carbon-doped $SiN_z$ having carbon present at 0.1 to 10.0 atomic percent, "z" being 0.5 to no more than 2.0;

forming vertically-alternating first tiers and second tiers of an upper portion of each of the first and second vertical stacks above its lower portion, and forming channel-material strings that extend through the first tiers and the second tiers in the upper portion in the first vertical stack to the lowest first tier in the lower portion in the first vertical stack;

forming horizontally-elongated trenches through the upper portion of the first vertical stack and that extend through the next-lowest second tier to the sacrificial material of the lowest first tier in the first vertical stack, the horizontally-elongated trenches individually being between immediately-laterally-adjacent of the memory-block regions in the first vertical stack;

through the horizontally-elongated trenches, replacing the sacrificial material in the lowest first tier with conductive material that directly electrically couples together channel material of the channel-material strings and the conductor material of the conductor tier, the at least one of the (a), the (b), and the (c) of the lowest second tier and the next-lowest second tier having the sacrificial material there-between remaining in the second vertical stack in a finished construction of the integrated circuitry, the second vertical stack being laterally outside of the memory-block regions;

after the replacing and prior to subsequent processing, removing the conductive material from within the horizontally-elongated trenches to expose the conductor tier; and forming an isolation material within the horizontally-elongated trenches in direct physical contact with an upper surface of the conductor tier along a bottom of the trenches, wherein the lowest second tier and the next-lowest second tier have different ones of the (a), the (b), and the (c).

21. The method of claim 1 wherein the sacrificial material comprises polysilicon that is vertically between the lowest second tier and the next-lowest second tier laterally outside of the memory-block regions during and after the replacing.

22. The method of claim 17 wherein the sacrificial material comprises polysilicon.

23. The method of claim 1 wherein the conductive material within the lowest first tier projects laterally to outside of the memory-block regions to within the horizontally-elongated trenches between the immediately-laterally-adjacent memory-block regions, the conductive material within the lowest first tier being discontinuous between the immediately-laterally-adjacent memory-block regions and having terminal ends that are within lateral confines of the horizontally-elongated trenches.

24. The method of claim 17 wherein the conductive material within the lowest first tier projects laterally to outside of the memory-block regions to within the horizontally-elongated trenches between the immediately-laterally-adjacent memory-block regions, the conductive material within the lowest first tier being discontinuous between the immediately-laterally-adjacent memory-block regions and having terminal ends that are within lateral confines of the horizontally-elongated trenches.

* * * * *